United States Patent [19]
Chow

[11] Patent Number: 5,240,749
[45] Date of Patent: Aug. 31, 1993

[54] METHOD FOR GROWING A DIAMOND THIN FILM ON A SUBSTRATE BY PLASMA ENHANCED CHEMICAL VAPOR DEPOSITION

[75] Inventor: Lee Chow, Winter Park, Fla.

[73] Assignee: University of Central Florida, Orlando, Fla.

[21] Appl. No.: 750,309

[22] Filed: Aug. 27, 1991

[51] Int. Cl.[5] .......................... B05D 3/06; B05D 5/12; C23C 16/00
[52] U.S. Cl. .................................. 427/575; 427/577; 427/122; 427/249
[58] Field of Search ...................... 427/45.1, 575, 577, 427/562, 573, 535, 113, 122, 249; 423/446

[56] References Cited

U.S. PATENT DOCUMENTS

| | | | |
|---|---|---|---|
| 4,929,489 | 5/1990 | Dreschhoff et al. | 428/195 |
| 4,938,940 | 7/1990 | Hirose et al. | 423/446 |
| 4,939,763 | 7/1990 | Pinneo et al. | 378/161 |
| 4,948,629 | 8/1990 | Hacker et al. | 427/53.1 |
| 4,950,463 | 8/1990 | Satoh et al. | 423/446 |
| 4,950,625 | 8/1990 | Nakashima et al. | 501/86 |
| 4,953,499 | 9/1990 | Anthony et al. | 118/724 |
| 4,958,591 | 9/1990 | Yamazaki | 118/723 |
| 4,958,592 | 9/1990 | Anthony et al. | 118/724 |

OTHER PUBLICATIONS

Kobashi et al.; "Synthesis of Diamonds by Use of Microwave Plasma Chemical Vapor Deposition: Morphology and Growth of Diamond Films"; The American Physical Society; vol. 38, No. 36; Aug. 15, 1988.

Kobashi et al.; "Morphology and Growth of Diamond Films Synthesized Using Microwave Plasma Chemical Vapor Deposition"; Asada Research Laboratory, Kobe Steel, Ltd., no date.

Messier et al.; "The Quest for Diamond Coatings"; Pennsylvania State University; Journal of Metals; Sep., 1987; pp. 8-11.

Graff; "Diamonds Find New Settings"; High Technology; Apr., 1987; pp. 44-47.

Yarbrough et al.; "Current Issues and Problems in the Chemical Vapor Deposition of Diamond"; Science; Feb. 9, 1990; vol. 247; pp. 688-696.

Martin et al.; "Epitaxial Growth of Crystalline, Diamond-Like Films on Si (100) by Laser Ablation of Graphite"; American Institute of Physics; Oct. 22, 1990; pp. 1742-1744.

Wild et al.; "Texture Formation in Polycrystalline Diamond Films"; American Institute of Physics; Aug. 1, 1990; pp. 973-978.

(List continued on next page.)

Primary Examiner—Marianne Padgett
Attorney, Agent, or Firm—James H. Beusse

[57] ABSTRACT

A method is provided for growing a diamond thin film on a selected substrate. First the substrate is prepared by scratching the surface thereof with diamond paste. The substrate is then confined in an enclosed space which includes high purity hydrogen and high purity methane gasses under relatively low pressure. The substrate is then irradiated with microwave energy to subject the substrate to a plasma exhibiting a first predetermined power density for a first period of time sufficient to form, on the substrate, diamond-like ball structure particles. The power density of the plasma to which the substrate is exposed is then effectively increased to a second predetermined power density and the substrate in exposed to the plasma for a second period of time sufficiently long such that (100) diamond faces grow on top of the ball structure particles. Finally, the irradiation of the substrate with the diamond-like ball structure particles thereon is continued at the second predetermined power density for a third period of time sufficient to cause the (100) faces on top of the particles to be joined together into a substantially continuous diamond film.

19 Claims, 2 Drawing Sheets

OTHER PUBLICATIONS

Phelps et al.; "Raman Examination of a Plasma Arcjet Deposited Diamond Film"; American Institute of Physics; Sep. 10, 1990; pp. 1090–1092.

Jeng et al.; "Oriented Cubic Nucleations and Local Epitaxy During Diamond Growth on Silicon (100) Substrates"; American Institute of Physics; May 14, 1990.

Grot et al.; "Selective Deposition of Homoepitaxial Diamond Film"; Pennsylvania State University, no date.

Geis; "Growth of Textured Diamond Films on Foreign Substrates from Attached Seed Crystals"; American Institute of Physics; Aug. 7, 1989; pp. 550–552.

Sandhu et al.; "Reactive Ion Etching of Diamond"; American Institute of Physics; Jul. 31, 1989; pp. 437–438.

Hsu et al.; "Low-Temperature Diamond Growth in a Microwave Discharge"; American Institute of Physics; Dec. 25, 1989; pp. 2739–2741.

Amaratunga et al.; "Crystalline Diamond Growth in Thin Films Deposited from a $CH_4/Ar$ rf Plasma"; American Institute of Physics; Aug. 14, 1989; pp. 634–635.

Wong et al.; "Tribological Properties of Diamond Films Grown by Plasma-Enhanced Chemical Vapor Deposition"; American Institute of Physics; May 15, 1989; pp. 2006–2008.

Narayan et al.; "On Epitaxial Growth of Diamond Films on (100) Silicon Substrates"; American Institute of Physics; Nov. 7, 1988; vol. 53, pp. 1823–1825.

Kobashi et al.; "Summary Abstract: Morphology and Growth of Diamond Films"; American Vacuum Society; May/Jun., 1988; pp. 1816–1817.

METHOD FOR GROWING A DIAMOND THIN FILM ON A SUBSTRATE BY PLASMA ENHANCED CHEMICAL VAPOR DEPOSITION

BACKGROUND OF THE INVENTION

This invention relates in general to diamond crystal growing techniques and, more particularly, to methods for growing diamond thin films on selected substrates. Diamond films exhibit numerous properties which are desirable in the optics and electronics industries. For example, diamond thin films are hard, transparent, chemically inert, electrically insulative or semi-conductive and exhibit relatively low friction.

In the recent past, several approaches have been employed to grow diamond thin films on various substrates. For practical applications in optics and electronics, the synthesis of large area, relatively smooth diamond thin films on silicon or other suitable substrates is very desirable. Unfortunately, due to lattice mismatch and random nucleation, generally only relatively rough poly-crystalline diamond films have been deposited on silicon substrates in the past. Such polycrystalline diamond films are typically formed by inter-growth of disjoint diamond crystallites, thus resulting in a very rough surface such as that depicted in FIG. 1 wherein diamond crystallites 2 are shown on a substrate 4. The morphology of these diamonds films is usually dominated by (111) or (100) oriented faces, depending on the particular deposition conditions selected. These (111) and (100) faces are generally randomly oriented in direction.

Several low-pressure chemical vapor deposition (CVD) techniques have been employed to achieve deposition of diamond films. For example, thermal chemical vapor deposition, plasma chemical vapor deposition, electron-assisted chemical vapor deposition have all been used for this purpose. Generally, CVD diamond deposition techniques involve introducing a variety of hydrocarbon gasses into a contained environment and subjecting a target substrate to a plasma in the presence of such gasses within the contained environment. Methane/hydrogen mixtures are commonly used as the aforementioned hydrocarbon gasses.

Other techniques such as RF sputtering and ion beam techniques have also been employed to achieve diamond deposition. Moreover, it is also known to irradiate a hydrocarbon vapor with a high powered pulsed laser to achieve deposition of diamond film at the point where the laser contacts a substrate.

Badzian has reported that, in a filament-assisted CVD system at temperature of 900 degrees C. or lower, (111) faces dominated the morphology of the deposited diamond film and, at temperatures of 1000 degrees C. or greater, (100) faces dominated the morphology. X Ray Analysis 31, 113 (1988) and Material Science Bulletin 23, 531, (1988).

It has also been reported by Kobashi et al. that, with a microwave CVD system in which the substrate temperature is 800 degrees C. and the methane concentration is 0.4% or less, (111) faces dominated the morphology of the deposited diamond film. In contrast, when the methane concentration was between 0.4% and 1,2%, (100) faces became the dominant faces of the diamond film morphology. Journal of Vacuum Science, A6, 1816 (1988) and Phys. Rev. B38, 4067 (1988).

When combining hot filament and microwave plasma CVD techniques, Wild et al. observed a preferential alignment of (110) planes perpendicular to the growth direction of the diamond film in their CVD system. Journal of Applied Physics 68, 973 (1990).

In contrast, Haubner and Lux found that, in their microwave CVD system, (100) faces dominated the morphology of the resultant diamond film when a 0.3% methane concentration was employed at 600 degrees C. At temperatures in excess of 750 degrees C., they found that (111) faces started to dominate the morphology of the diamond film. Int. J. Refract. Hard Mat. 6, (1987).

Also, Jeng et al. report the oriented cubic nucleation of diamond and local epitaxial diamond growth on a (100) silicon substrate using microwave CVD technique. Applied Physics Letters 56, 1968 (1990).

In yet another deposition technique, Ravi and Koch employed an acetylene torch to deposit diamond and diamond-like thin film on a molybdenum substrate. Ravi and Koch report that both the dangling bonds and the hydrogen content in the diamond thin film increase the nucleation rate. They also report their belief that this increase in nucleation rate leads to multiple twins and dendritic growth. Applied Physics Letters 57, 348 (1990).

Chang et al. report diamond crystal growth by plasma chemical vapor deposition employing a microwave discharge tube reactor to generate a plasma. $CH_4$, $H_2$ and $O_2$ gasses were fed into the discharge tube. When a silicon wafer was situated within the plasma region in the reactor, diamond crystals were grown in the plasma region of the wafer. J. Applied Physics, 63, 1744 (1988).

Unfortunately, the above referenced diamond deposition methods are not known to form large area, relatively smooth diamond thin film layers. As remarked earlier, such large area relatively smooth diamond layers are very desirable on substrates such as silicon, for example, for various optics and electronics applications.

SUMMARY OF THE INVENTION

One object of the present invention is to provide a method of depositing large area, relatively smooth diamond thin films on silicon or other substrates.

Another object of the present invention is to provide a method for growing a substantially smooth (100) oriented diamond surface on a selected substrate.

In accordance with the present invention, a method is provided for growing a diamond thin film on a selected substrate. The method includes the step of confining the substrate in an enclosed space which includes high purity hydrogen and high purity methane gasses under relatively low pressure. The method further includes the step of irradiating the substrate with microwave energy exhibiting a first predetermined power density to subject the substrate to a plasma for a first predetermined period of time sufficient to form, on the substrate, diamond-like ball particles. The method includes the step of increasing the power density of the microwave energy to a second predetermined power density to subject the substrate to a more intense plasma for a second predetermined period of time sufficient to form (100) diamond faces on top of the diamond-like ball particles. The method also includes the step of continuing to irradiate the substrate with the diamond-like ball particles thereon for a third predetermined period of time sufficient to cause the (100) faces on top of the particles to be joined together into a semi-continuous diamond film.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings in which:

DETAILED DESCRIPTION OF THE INVENTION

Figure 2:
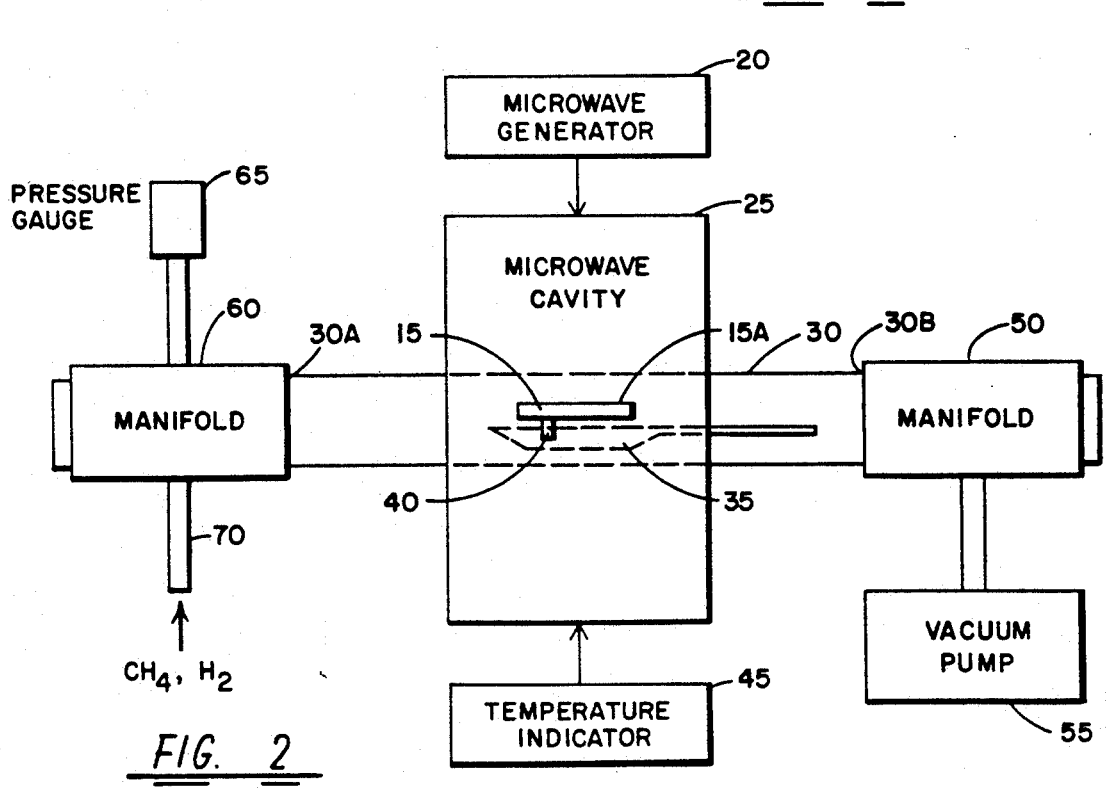
FIG. 2 a block diagram of a diamond thin film deposition apparatus which may be employed to practice the method of the present invention.

FIG. 2 shows a chemical vapor deposition apparatus 10 which is employed to deposit diamond thin films on a substrate 15 in accordance with the method of the present invention. Although silicon was employed as the substrate in this particular embodiment of the method, those skilled in the art will appreciate that the method is applicable to other substrates as well.

Figure 1:
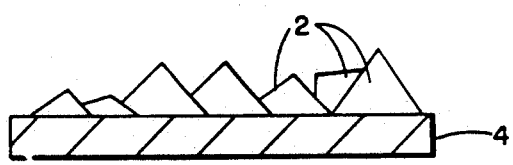
FIG. 1 is a representation of diamond crystallites grown on a substrate by conventional chemical vapor deposition techniques.

In this particular embodiment, a 100 Watt 2.45 Ghz microwave generator 20 is coupled to a Evenson-type microwave cavity 25 in which substrate 15 is situated. A reaction chamber 30 is formed by a ½ inch diameter quartz tube which passes through microwave cavity 25 as shown in FIG. 1. Reaction chamber 30 includes opposed ends 30A and 30B.

Substrate 15 is supported within cavity 25 by standard techniques which will not be discussed in detail. For example, a substrate holder 35 made of high purity graphite will readily suffice to support substrate 15. A K-type thermocouple 40 is situated in a hole (not shown) in holder 35 adjacent substrate 15. Thermocouple 40 is sealed in the hole with high temperature cement. Thermocouple 40 is coupled to a temperature indicator 45 by conventional coupling techniques known to those skilled in the art.

A manifold 50 is connected to reaction chamber end 30B to seal end 30B from the surrounding environment. A vacuum pump 55 is connected to manifold 50 to enable reaction chamber 30 to be pumped down to relatively low pressures suitable for chemical vapor deposition as later described. A manifold 60 is connected to reaction chamber end 30A as shown in FIG. 2 to seal end 30B. A pressure gauge 65 is connected to manifold 60 to enable the pressure within reaction chamber 30 to be monitored. Manifold 60 includes an inlet 70 through which high purity (99.7%) methane ($CH_4$) and (99.999%) hydrogen ($H_2$) gasses are introduced. Gas flow rates are monitored and controlled by mass flow controllers, not shown in FIG. 1. Methane and hydrogen gasses are introduced into reaction chamber 30 to form a 1.5% methane in hydrogen gas environment within chamber 30 in one embodiment of the method.

In one embodiment of the method of the invention, an n-type (100) silicon wafer having a relatively flat surface 15A is employed as substrate 15. To prepare substrate 15 for diamond film growth, surface 15A is scratched with diamond paste prior to placement in reaction chamber 30. Holder 35, with substrate 15 thereon, is placed in reaction chamber 30. Typical diamond film deposition conditions were found to be a substrate temperature of approximately 680 degrees C. to approximately 750 degrees C. as measured by thermocouple 40, a reaction chamber pressure of approximately 30 Torr to approximately 80 Torr as measured by pressure gauge 65, and a microwave power of approximately 40 Watts to approximately 65 Watts. The size of the plasma ball within which substrate 15 is enveloped under these deposition conditions was found to be approximately 0.5 cm or less.

Figure 3:
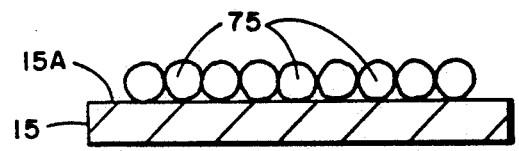
FIG. 3 is a representation of diamond-like ball structures grown on a substrate in one step in the method of the present invention.

After substrate 15 is subjected to the above deposition conditions for a first period of time having a duration of approximately 1 hour, an initial growth of diamond-like ball structure particles on substrate surface 15A is observed. The growth of such diamond-like ball particles on substrate surface 15A is depicted in FIG. 3. which shows such ball particles as particles 75. It is noted that the above described operating conditions result in substrate 15 being exposed to a plasma exhibiting a first predetermined power or energy density during the first time period.

Figure 4:
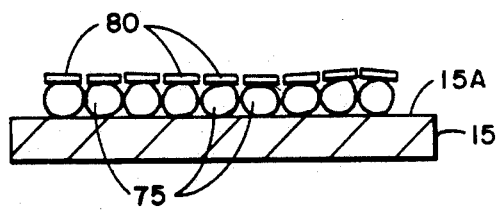
FIG. 4 is a representation of (100) diamond faces grown on diamond-like ball structures in another step in the method of the present invention.

Then, after the ball structure particles 75 are formed, the power or energy density to which substrate 15 is subjected is substantially increased to a second predetermined power or energy density. The resultant deposition conditions are continued for a second period of time sufficiently long such that an initial growth of (100) diamond faces or plates 80 on top of the ball structure particles 75 as achieved as shown in FIG. 4. In one embodiment, it has been found that a second time period of approximately 1 hour duration is sufficient to begin formation of the aforementioned (100) faces or plates 80.

In other words, during the first period of time, a growth of diamond-like ball structure particles 75 is observed and then, after the second period of time during which substrate 15 is subjected to more intensive ion bombardment, the aforementioned (100) diamond plates or faces 80 are observed to grow on top of diamond-like particles 75. The increase in the power or energy density of the plasma between the first and second predetermined energy levels is discussed later in more detail.

Figure 5:
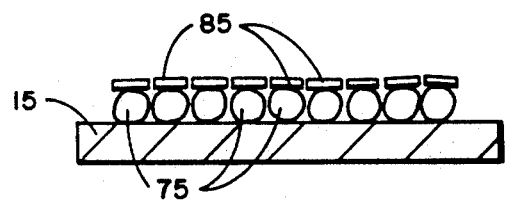
FIG. 5 is a representation of a semi-continuous diamond film formed by horizontal growth of the (100) diamond faces in another step of the method of the present invention.

After such (100) plates or faces 80 first appear, the diamond deposition is then continued for a third period of time under the above described conditions at the second predetermined power or energy density until the (100) diamond plates or faces 80 are connected together to form a semi-continuous thin film such as shown in FIG. 5 as film 85. The third period of time is sufficiently long such that the (100) diamond faces form the aforementioned semi-continuous diamond thin film. In one embodiment of the method of the invention, a third time period of approximately five to six hours was found to be sufficient to permit the semi-continuous diamond thin film to be formed on the substrate, although somewhat shorter or longer time periods will also produce acceptable results.

An alternative way of describing the process of the invention would be to not differentiate the period of more intensive ion bombardment into second and third time periods. Rather, the time period of more intensive ion bombardment at the second predetermined power or energy density level is continued sufficiently long such that (100) diamond faces 80 form on the diamond-shaped ball particles 75 on substrate 15 and is further continued until the (100) faces become semi-continuous as depicted in FIG. 5.

The region of substrate 15 which was situated in the center of the plasma includes large size (100) faces which are fused together to form semi-continuous film 85. Steps on (100) faces 80 are readily observable thus indicating that diamond growth on the (100) faces is dominated by a step growth mechanism in the region of sample 15 located at the center of the plasma. It is noted however that individual diamond-like particles are still observable in the region of substrate 15 which was situated at the edge of the plasma. The necessity of continuing ion bombardment for the above described first, second and third time periods to achieve the desired diamond thin film morphology is thus appreciated.

Since during the second time period the (100) faces are grown on top of the diamond-like ball particles formed during the first time period, the (100) faces are substantially aligned in the same direction. When deposition is continued for the aforementioned third time period, this results in a rather smooth (100) oriented substantially continuous diamond film. It is believed that this is the first time that deposition of a substantially smooth, semi-continuous and (100) oriented diamond thin film has been achieved.

The (100) plane of the deposited diamond film 85 is oriented approximately perpendicular to substrate surface 15A. The deposited film is polished with a diamond paste or other suitable method to further smoothen the diamond film. It will be readily appreciated that a smooth diamond film surface is very desirable for optics and electronics applications. A four axis diffractometer using Cu K$\alpha$ radiation can be employed to perform texture measurements on substrate 15 after removal from reaction chamber 30.

As discussed earlier, during the first period of time, substrate 15 is exposed to a plasma which exhibits a first predetermined energy or power density. Assuming that the microwave power associated therewith is approximately 40 Watts and further assuming that the energy distribution is homogenous, then the power density of the 0.5 cm plasma ball is approximately 600 Watts/cm$^3$. During the second period of time (and the third time period), the energy or power density of the plasma is substantially increased. This is accomplished for example by raising substrate 15 within reaction chamber 30 so as to further confine the plasma thus effectively substantially increasing the energy density of the plasma region. Alternatively, the energy or power density of the plasma is substantially increased by increasing the microwave power, for example, from the earlier 40 Watt power to a power of approximately 65 Watts. When the energy or power density is increased in this manner, the resultant second predetermined power density is approximately 1000 Watts/cm$^3$. The specific first and second predetermined power densities discussed above are given for purposes of example. It should be appreciated that these first and second predetermined power densities will vary from the examples discussed above and will depend on the particular apparatus and conditions employed in carrying out the method. What is important is that, after the diamond-like ball particles 75 form on substrate 15 during exposure of substrate 15 to the first predetermined power density plasma during the first time period, then the power density of the plasma is substantially increased to a second predetermined power density sufficiently high to cause (100) diamond faces or plates 80 to form on such particles 75 during the second time period.

Figure 6:
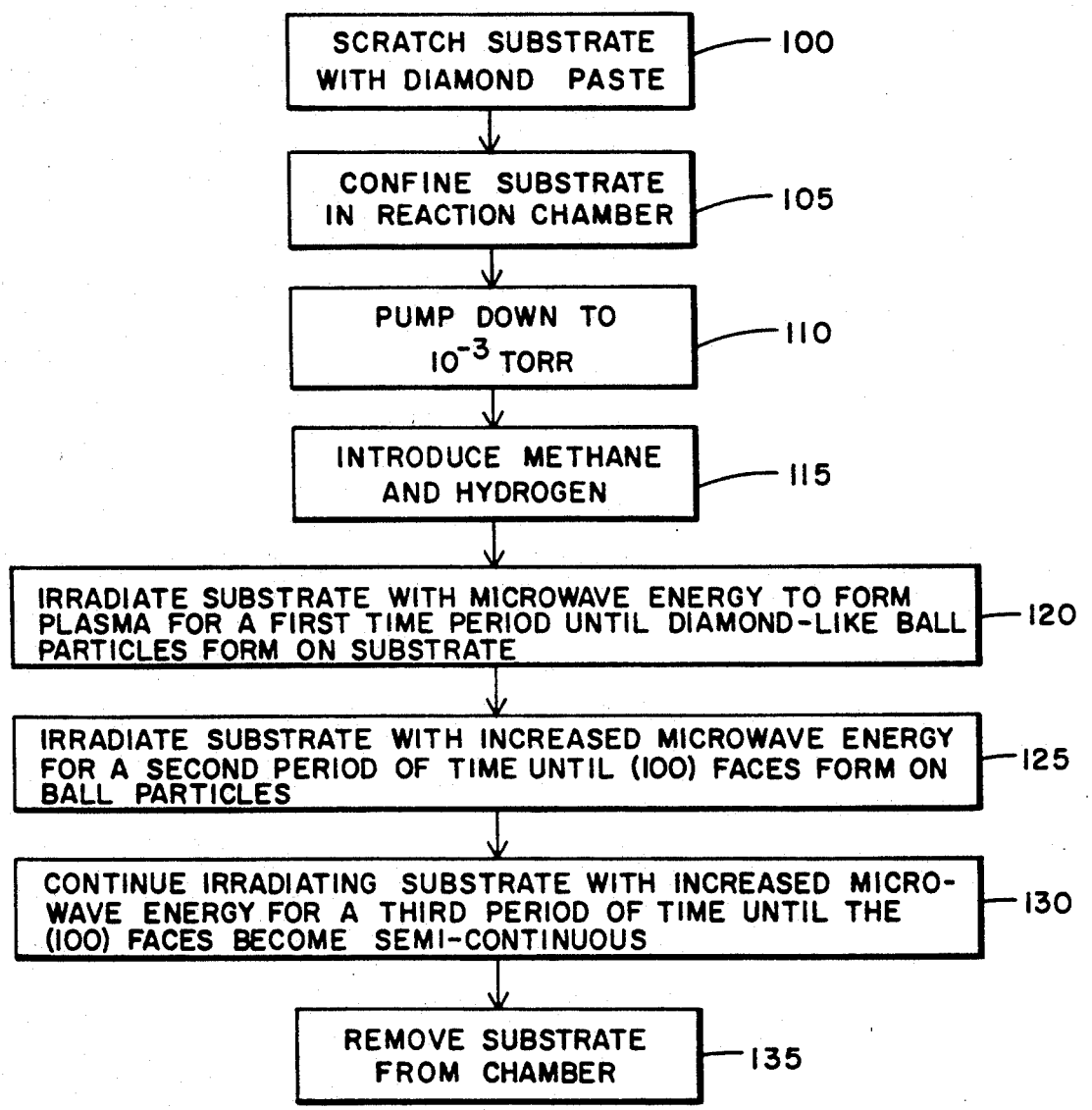
FIG. 6 is a flow chart which depicts the steps employed in one embodiment of the method of the present invention.

FIG. 6 is a flow chart which depicts the steps of the method of the present invention in summary fashion. First, the substrate is scratched with diamond paste as per block 100. Then, the substrate is confined within the reaction chamber described earlier as per block 105. The reaction chamber is then pumped down to the relatively low pressure such as 10$^{-3}$ Torr, for example, as per block 110. Hydrogen and methane are introduced into the reaction chamber as per block 115. The pump rate of the hydrogen and methane into the reaction chamber is controlled by a microvalve (not shown) such that the pressure within the reaction chamber is within the range of approximately 30 Torr to approximately 80 Torr. The substrate is then irradiated with microwave energy exhibiting sufficient intensity to create a plasma causing the substrate to assume a temperature of approximately 680–750 degrees C. The exposure of the substrate to this plasma is administered for a first period of time sufficiently long to permit an initial growth of diamond-like ball-particles to appear on the substrate as per block 120. After these diamond-like ball-particles appear on the substrate, the power density of the plasma is substantially increased and exposure of the substrate to the plasma is continued for a second period of time sufficiently long for (100) diamond faces or plates to be formed top of the diamond-like ball particles as per block 125. The power density of the plasma is increased for example by either increasing the microwave power or by raising the substrate to decrease the volume of the plasma region within the reaction chamber. After the (100) diamond faces or plates appear on the diamond-like ball particles, deposition is continued for a third period of time at the increased microwave power density level until the (100) faces or plates join together to form a semi-continuous diamond film as per block 130. This additional exposure of the (100) diamond faces or plates during the third time period causes the individual plates to grow horizontally until they are substantially joined together. A well-faceted and relatively smooth, substantially continuous diamond thin film is thus formed on the substrate surface. The substrate is then removed from the reaction chamber as per block 135.

The foregoing describes a method for growing (100) oriented diamond thin films on a silicon substrate using microwave enhanced chemical vapor deposition. Since the diamond crystallites deposited during the aforementioned second and third time periods were grown on top of a layer of diamond-like particles deposited during the aforementioned first time period, the faces of the crystallites are all pointed substantially in the same direction with a spread of approximately 10 degrees. In accordance with the method of the invention, these crystallites can connect together and form a relatively smooth, semi-continuous diamond thin film.

While only certain preferred features of the invention have been shown by way of illustration, many modifications and changes will occur to those skilled in the art. It is, therefore, to be understood that the present claims are intended to cover all such modifications and changes which fall within the true spirit of the invention.

What is claimed is:

1. A method for growing a diamond film exhibiting substantially continuous and substantially aligned (100) faces on a selected substrate having a surface, said method comprising the steps of:
   confining said substrate in an enclosed space which includes hydrogen and methane gasses under relatively low pressure of less than about 80 Torr;
   irradiating the surface of said substrate with microwave energy exhibiting a first power density to subject said substrate to a plasma for a first period of time sufficient to form, on the surface of said substrate, diamond-like ball particles;
   substantially increasing the power density of said microwave energy to a second power density to subject the surface of said substrate to a substantially more intense plasma for a second period of time sufficient to form (100) diamond faces on top of said diamond-like ball particles, and
   growing the (100) faces on top of said particles in direction substantially parallel to the surface of said substrate until said (100) faces become substantially joined together to form a substantially continuous film with said (100) faces being substantially aligned with one another by continuing to irradiate the surface of said substrate at said second power density for a third period of time.

2. The method of claim 1 including the step of scratching said substrate with diamond paste prior to said confining step.

3. The method of claim 1 wherein said first period of time is approximately 1 hour.

4. The method of claim 1 wherein said second period of time is approximately 1 hour.

5. The method of claim 1 wherein said third period of time is between about five and six hours.

6. The method of claim 1 wherein said relatively low pressure is within the range of approximately 30 to approximately 80 Torr.

7. The method of claim 1 wherein said irradiating step, said increasing the power density step and said continuing to irradiate step subject said substrate to a plasma resulting in said substrate exhibiting a temperature of approximately 680 degrees C. to approximately 750 degrees C.

8. The method of claim 1 further comprising the step of polishing said substantially continuous diamond film subsequent to said growing step.

9. The method of claim 1 wherein the first power density employed in said irradiating step is approximately 600 Watts/cm$^3$.

10. The method of claim 1 wherein the second power density employed in said substantially increasing the power density step and said growing step is approximately 1000 Watts/cm$^3$.

11. A method for growing a diamond film exhibiting substantially continuous and substantially aligned (100) faces on a silicon substrate having a surface, said method comprising the steps of:
    scratching the surface of said substrate with diamond paste;
    confining said substrate in an enclosed space which includes hydrogen and methane gasses;
    pumping said enclosed space down to a relatively low pressure of less than about 80 Torr;
    irradiating the surface of said substrate with microwave energy exhibiting a first power density to subject the surface of said substrate to a plasma for a first period of time sufficient to form, on the surface of said substrate, diamond-like ball particles;
    substantially increasing the power density of said microwave energy to a second power density to subject said substrate to a substantially more intense plasma for a second period of time sufficient to form (100) diamond faces on top of said diamond-like particles, and
    growing the (100) faces on top of said particles in directions substantially parallel to the surface of said substrate until said (100) faces become substantially joined together to form a substantially continuous film with said (100) faces being substantially aligned with one another by continuing to irradiate the surface of said substrate at said second power density for a third period of time.

12. The method of claim 11 wherein said first period of time is approximately 1 hour.

13. The method of claim 11 wherein said second period of time is approximately 1 hour.

14. The method of claim 11 wherein said third period of time is between five and six hours.

15. The method of claim 11 wherein said relatively low pressure is within the range of approximately 30 to approximately 80 Torr.

16. The method of claim 11 wherein said irradiating step, said increasing the power density step and said continuing to irradiate step subject said substrate to a plasma resulting in said substrate exhibiting a temperature of approximately 680 degrees C. to approximately 750 degrees C.

17. The method of claim 11 further comprising the step of polishing said substantially continuous diamond film subsequent to said growing step.

18. The method of claim 11 wherein the first power density employed in said irradiating step of approximately 600 Watts/cm$^3$.

19. The method of claim 11 wherein the second power density employed in said substantially increasing the power density step and said growing step is approximately 1000 Watts/cm$^3$.

* * * * *